United States Patent [19]

Markow et al.

[11] Patent Number: 5,077,519

[45] Date of Patent: Dec. 31, 1991

[54] PULSE PERIOD TO FREQUENCY CONVERSION SYSTEM

[75] Inventors: Paul A. Markow, Huntsville; Kevin R. Hammond, Madison; Donald E. Hutchings, Decatur, all of Ala.

[73] Assignee: Chrysler Corporation, Highland Park, Mich.

[21] Appl. No.: 589,238

[22] Filed: Sep. 28, 1990

[51] Int. Cl.$^5$ .............................................. G01R 23/02
[52] U.S. Cl. ............................... 324/78 D; 324/79 D; 377/47; 377/49
[58] Field of Search ........................ 377/47, 48, 41, 49; 364/761, 765, 766, 767; 324/78 D, 79 D

[56] References Cited

U.S. PATENT DOCUMENTS

| | | | |
|---|---|---|---|
| 3,525,039 | 8/1970 | Mindheim | 324/78 D |
| 4,093,850 | 6/1978 | Karnowski | 324/78 D |
| 4,301,405 | 11/1981 | Carlson | 324/78 D |
| 4,788,646 | 11/1988 | Herzl | 324/78 D |

Primary Examiner—Kenneth A. Wieder
Assistant Examiner—Jose M. Solis
Attorney, Agent, or Firm—Wendell K. Fredericks

[57] ABSTRACT

A frequency conversion system for converting a pulse period into a frequency value by calculating a reciprocal value of a binary digit value of a pulse period from a remote period counter. The system uses the binary digit as a divisor and successively adds the divisor until a running sum results in (1) greater than a chosen dividend value or (2) the number of additions needed to reach a chosen dividend value is reached. A second embodiment is included which contains a local period counter.

7 Claims, 7 Drawing Sheets

PULSE PERIOD TO FREQUENCY CONVERSION SYSTEM

BACKGROUND OF THE INVENTION

1. Field of the Invention

The present invention relates generally to pulse period to frequency conversion systems and, in particular, to a system for converting periods to frequency by establishing a running sum of a division until a dividend value or a maximum quotient value results.

2. Description of the Prior Art

Prior frequency determining schemes employed structures for performing division utilizing dividers, latches and subtracting circuits when converting pulse periods into frequency.

Also digital division has been accomplished by using microprocessor programming techniques.

Such techniques yield favorable results but a large number of pulse generating decoders, internal counters, subtractors, adder circuits and/or look-up tables are generally required.

In an effort to minimize circuit requirements, a search was devised to perform computing reciprocal value of time periods using a minimum of components. The search resulted in the present invention which derives a frequency value from a time period value.

BRIEF SUMMARY OF THE INVENTION

The present invention performs a sequential operation which adds a pulse period value within a pulse period interval in a manner that yields a frequency value equivalent to the reciprocal of the time period.

BRIEF DESCRIPTION OF THE DRAWING FIGURES

DETAILED DESCRIPTION OF A PREFERRED EMBODIMENT

Figure 1:
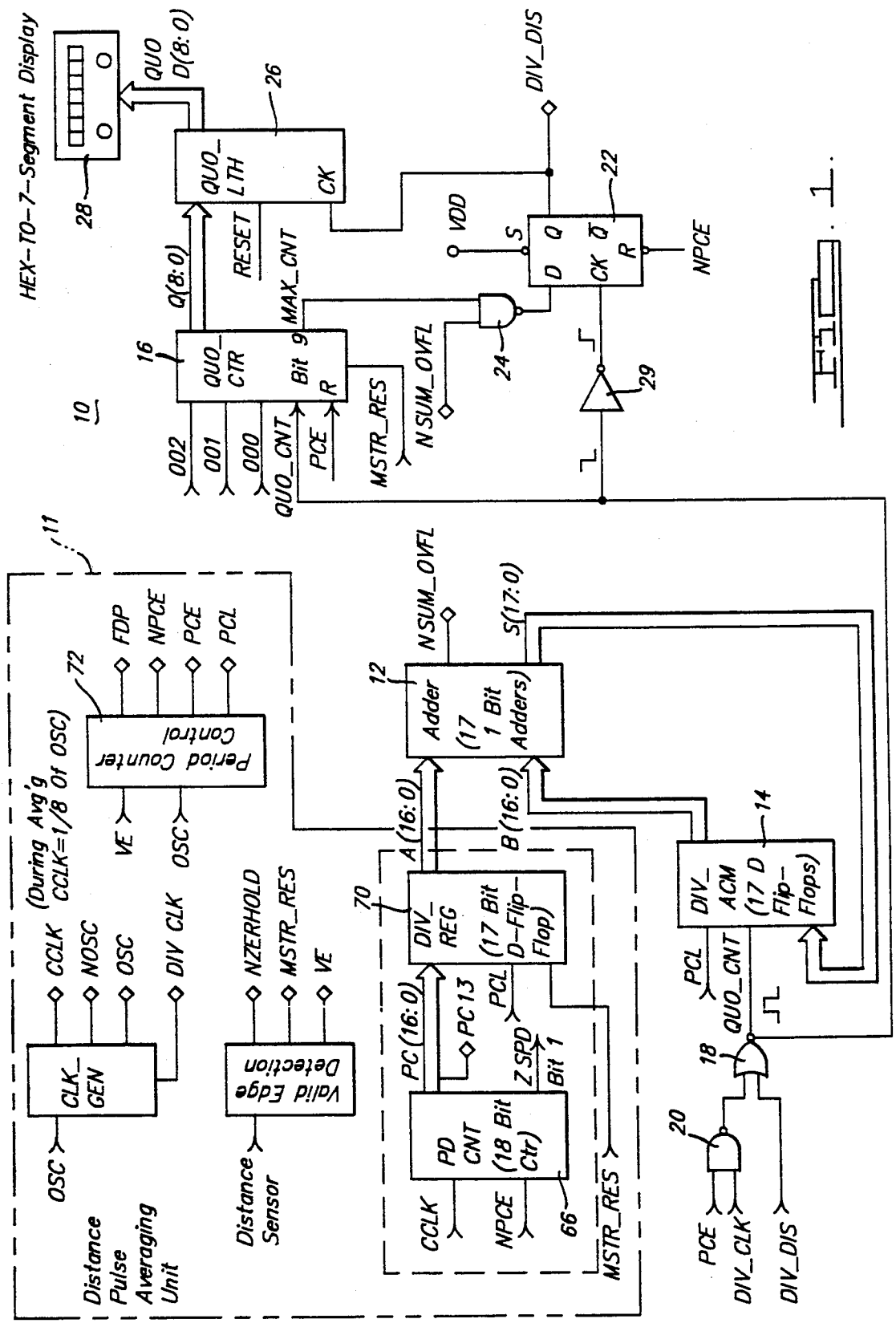
FIG. 1 is a block diagram of a time period to frequency conversion system which sets the operating environment for computing frequency of distance pulse signals of the invention.

With reference to FIG. 1, a logic diagram illustrates a circuit for converting measures of periods of distance pulses being outputted from a distance sensor into frequency values. The frequency values equate to steps/-degrees of a mph meter scale.

To determine speed, this circuit accepts measured value of periods of the distance pulses and converts the periods into corresponding step values. These step values represent frequency of the distance pulses which convert readily into mph values.

Assuming an analog speedometer has a display resolution of 512 steps per 360 degrees of pointer sweep, this number of steps can provide a perceived smooth needle movement without the need for excessively large counters or look-up tables. If a distance sensor provides 8,000 pulses per mile, a speedometer dial with the above resolution could indicate speeds up to 125 miles per hour over a sweep range of 270 degrees. With these relationships known, the distance pulse frequency for one step of the pointer can be determined as follows in equation 1:

$$(1\ step) \times (360°/512\ steps) \times (125\ mi/270°\ hr) \times (1\ hour/3600\ sec) \times (8000\ pulses/mi) = 0.7233\ Hz \quad (1)$$

The distance pulse period of one step is the reciprocal of the computed frequency or 1.3824 seconds. Similarly, the distance pulse frequency at 125 mph, or 384 steps, equals 277.77 hertz which translates to a period of 3600 microseconds.

For slow speeds of the drive shaft, the period of each pulse is measured to provide the quickest update of speed information possible. For higher frequencies (high speed), to accurately distinguish between one speed and the next requires a count of many distance pulses. Both high and low speed measurements require between 3.6 milliseconds and 1382 millisecond time intervals.

In order to distinguish between steps at high speeds, a count clock period of about 4.5 microseconds is required. A period counter used for counting clock pulses during the distance pulse periods must, therefore, have the capacity of counting up to a decimal value of about 300,000. A counter of 262144 decimal binary (17 bits) or a modulo 18 can provide adequate resolution at the high speed end as well as a sufficient count at the low speed end. When the slowest displayable speed occurs, the counter will have a count of 262144; and, when the crank shaft stops, the counter will roll over to cause the displayed speed to indicate zero.

By dividing the count length, 262144, by the longest measurable speed period, 1.3824 seconds, yields the clock frequency of the period counter. To obtain a period count frequency of 189.63 kilohertz, select an oscillator circuit having a frequency of ten times the counter clock frequency. This will allow the generation of addition clock edges to sequence data and control signals throughout the circuitry.

OBTAINING FREQUENCY BY A DIVISION PROCESS

Period counting occurs in the distance pulse averaging unit 11 or an equivalent circuit. A co-pending application of Paul Markow, et al., Ser. No. 07/546,608 entitled "Distance Pulse Averaging Unit" and filed June 29, 1990 and now is U.S. Pat. No. 5,007,035 issued Apr. 9, 1991 describes such an averaging system. After latching a period count in a Division Register (DIV_REG) 70 of the averaging unit, bus "A" transfers the count to an Adder circuit 12 of a period to frequency converter circuit 10 of this invention.

Circuit 10, in essence, calculates the reciprocal of the count stored in the division register 70 by a novel division process. In this process, the count in the division register is successively added to itself until a running sum exceeds 262144 or until the number has been added to the sum 512 times.

The Adder 12 containing, illustratively, 17, one-bit Adder circuits, receives at a first input, bus "A", a period count latched in the Division Register 70 upon the Division Register 70 receiving a period count latch (PCL) signal from a period counter control circuit 72. Adder 12, not clocked by any clock signal, adds this period count received from bus "A" over and over again in forming a running sum of the period count by additions of period count sums at a second input, routed over bus "B", from a division accumulator (DIV_ACM) 14. Initially, Adder 12 sums the count on bus "A" to a zero (0) count on bus "B" and then outputs the initial sum over an output port to a bus "S" which routes this sum to the DIV_ACM 14.

The DIV_ACM 14, illustratively a 17-bit latch, receives the counts from Adder 12 over bus "S" and accumulates a running sum of the counts during the division process. The DIV_ACM 14 outputs the running sum over bus "B" to Adder 12 in response to a clock signal "QUO_CNT". An initial sum in DIV_ACM 14 adds to the sum received from bus "S" to establish the first running sum that outputs over bus "B" to Adder 12. DIV_ACM 14 resets when PCL goes to a logical "1".

Unlike Adder 12, DIV_ACM 14 responds to a rising edge of a clock signal QUO_CNT used to transfer each running sum from DIV_ACM 14 to bus "B".

Adder 12, having a binary count length of 262144 decimal, overflows when the sum of the count on bus "A" and bus "B" exceeds 262144. An NSUM_OVFL signal sets at an output terminal of Adder 12 when an overflow occurs which also indicates the division process is complete.

The QUO_CNT signal also routes to a programmable quotient counter (QUO_CTR) 16. QUO_CTR 16, a 9-bit register, counts each QUO_CNT signal, which occurs during each count sequence of the DIV_ACM 14 to accomplish the running sum. If bit 9 of the QUO_CTR 16 sets, this will provide an indication that a maximum of 512 divide sequences occurred and the division process is complete. Line OD0, OD1, and OD2 permits changing the initial count of the counter if circuit tolerances require a change.

As evidence from the above scenario, either reaching a count of 262144 or greater in Adder 12 or a count of 512 in QUO_CTR 16 will terminate the division process and produce a count in QUO_CTR 16 that indicates a quotient, the number of times the period count divides into 262144. Any remainder value is disregarded. This quotient outputs from QUO_CTR 16 over bus "Q" and is received by a latched-in Quotient-latch (QUO_LTH) 26. QUO_LTH 26, a 9-bit latch, holds the quotient until the next quotient computations. QUO_LTH 26 outputs the quotient value over a bus "D" to, illustratively, a 7 segment decimal display 28, from which an observer may use this quotient as a step value on a speedometer scale relative to the frequency value depicted in equation 1.

FLOW CHART REPRESENTATIONS

Figure 2:
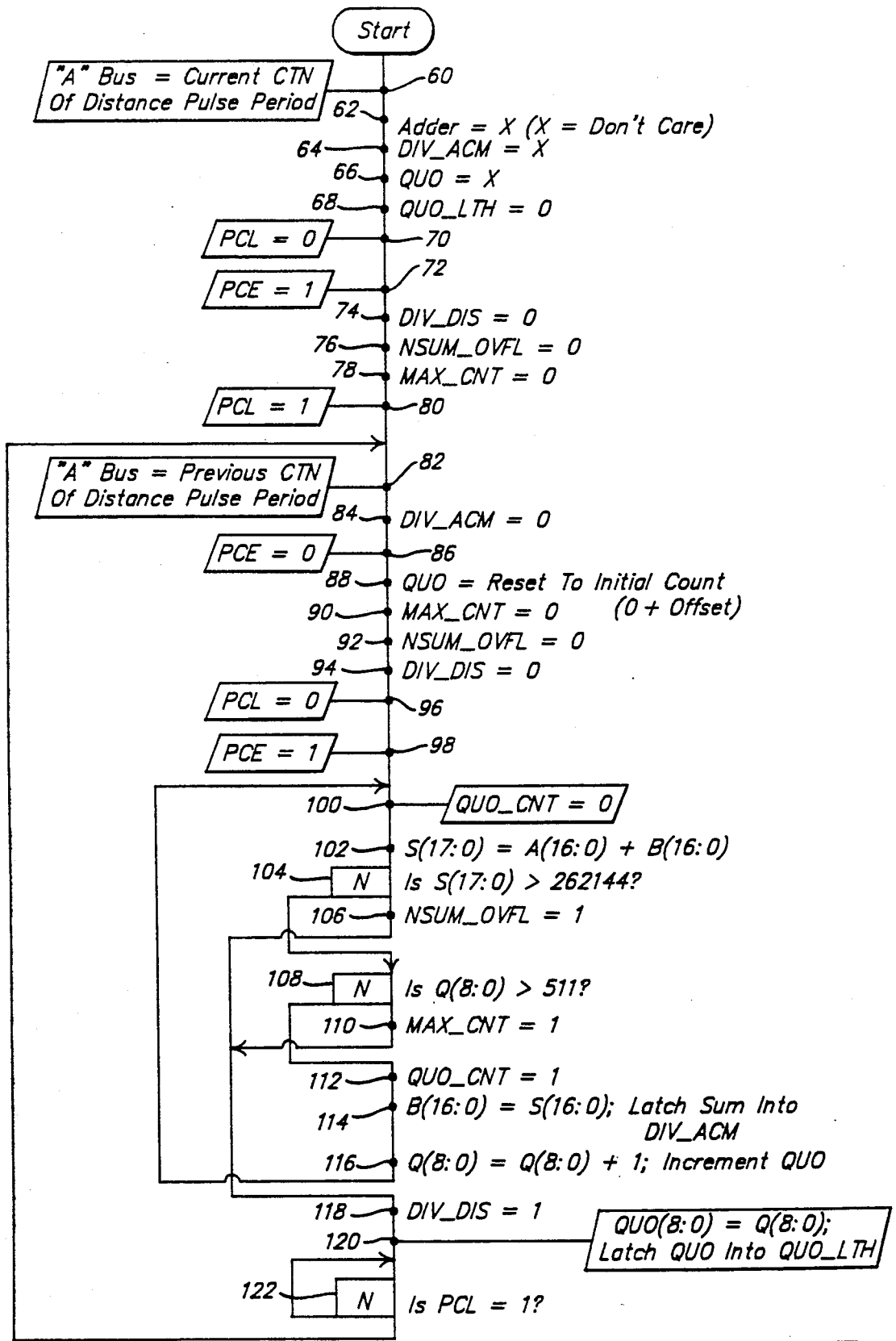
FIG. 2 depicts in flowchart form the operation of the system of FIG. 1.
Figure 3:
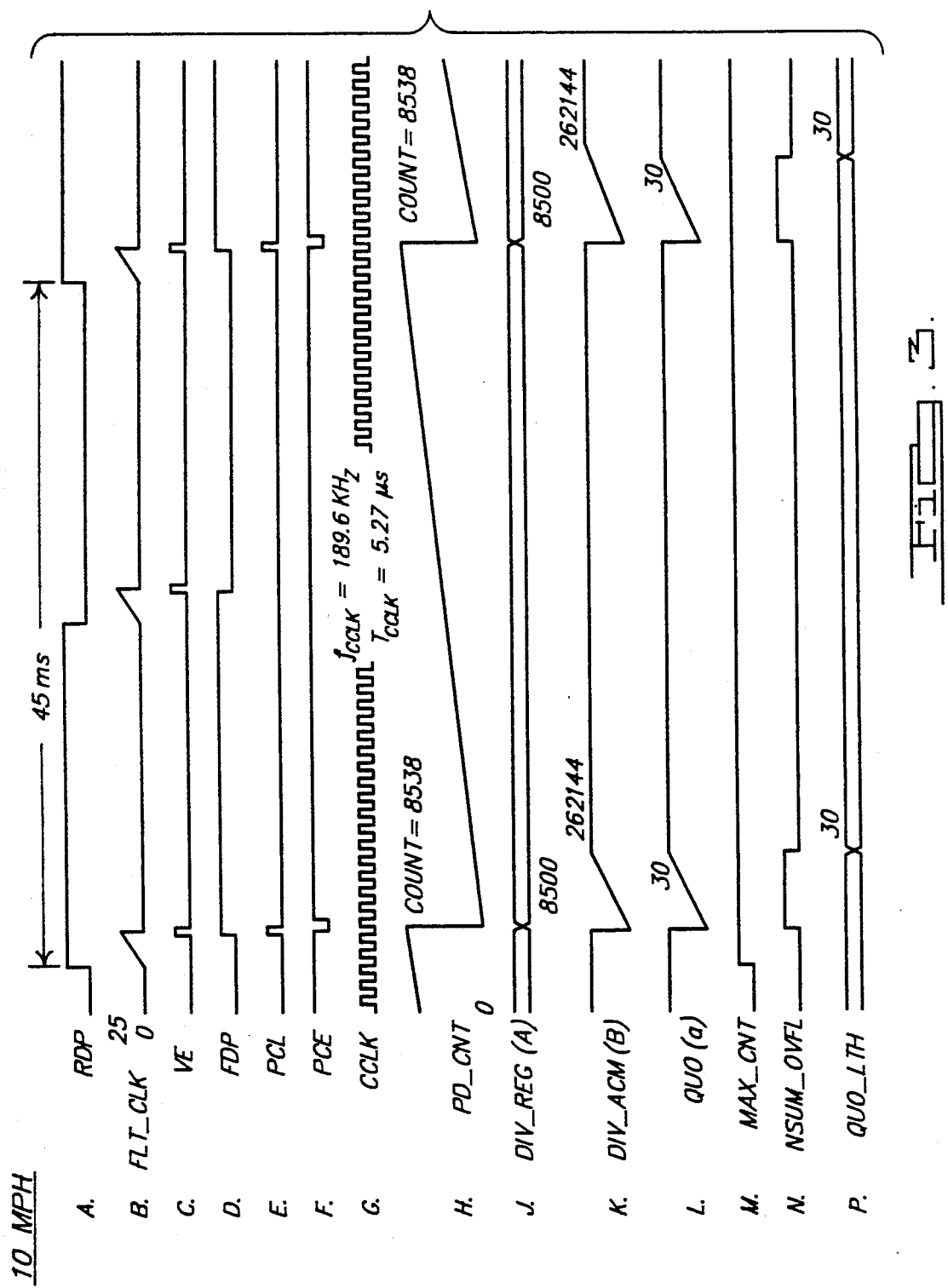
FIGS. 3A-3P, FIGS. 4A-4R, FIGS. 5A-5Q and FIGS. 6A-6Q depict timing diagrams illustrative of various signals with respect to a raw distance pulse signal entering the conversion system of FIG. 1.
Figure 4:
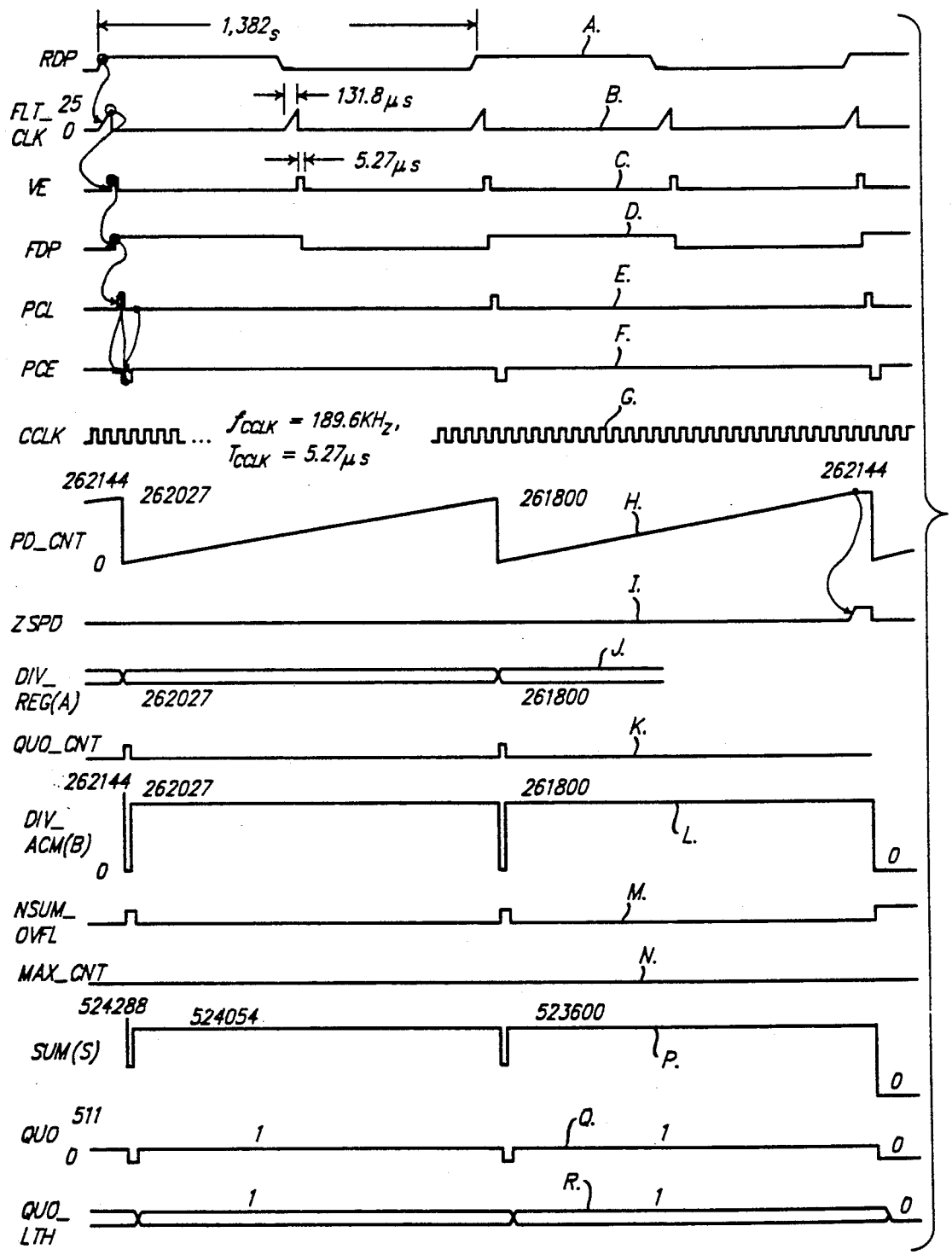
Figure 5:
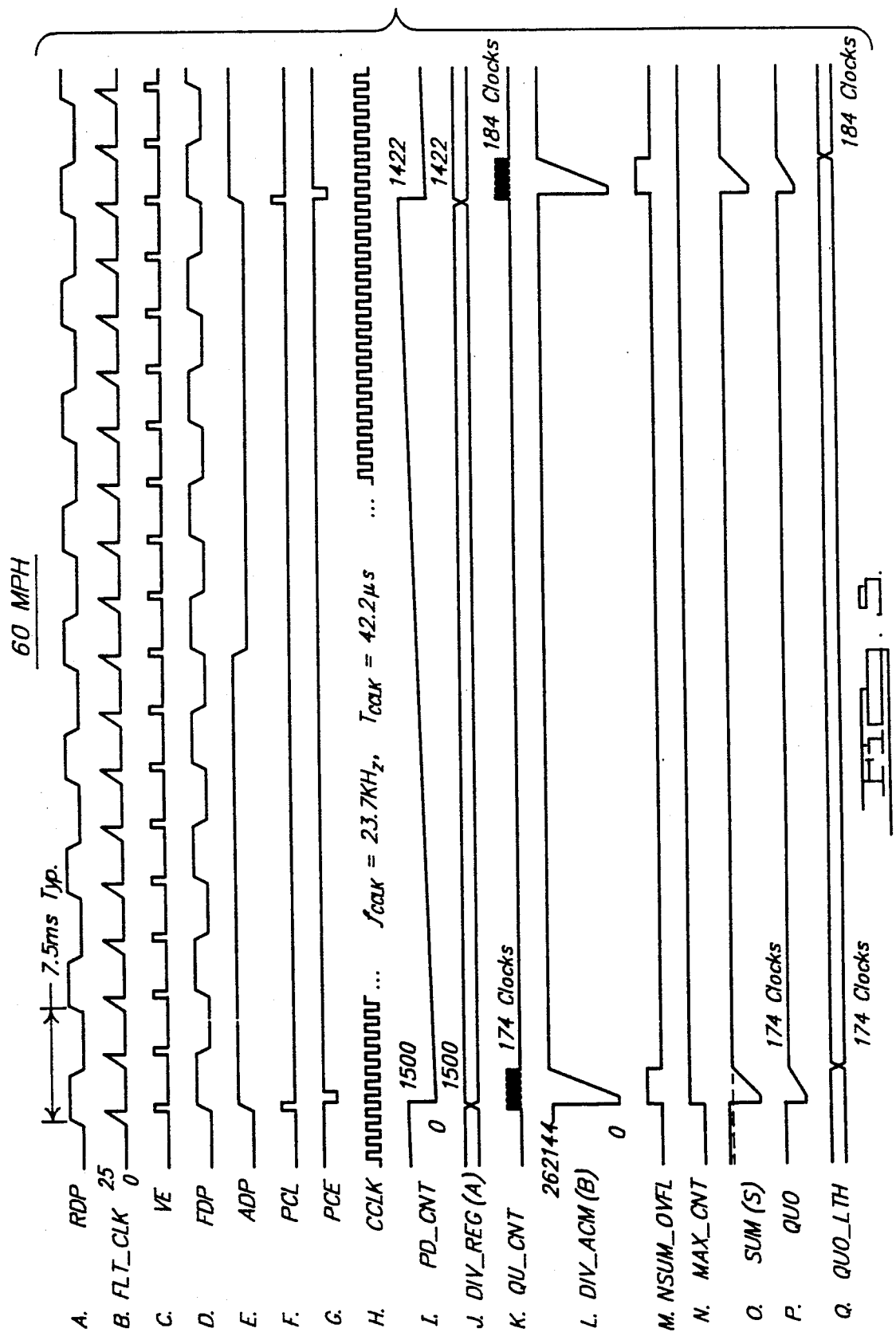
Figure 6:
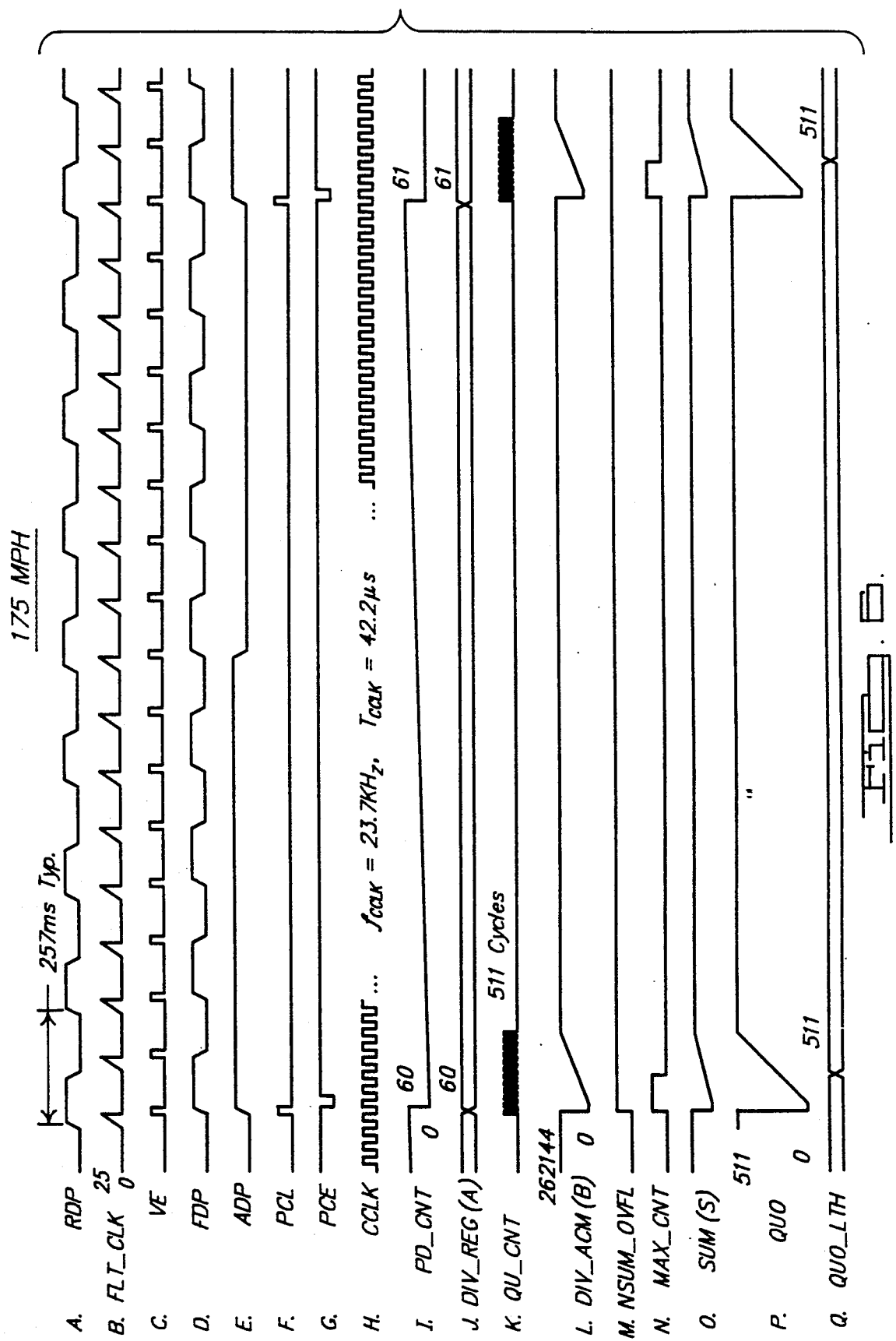

Refer now to FIG. 2. This chart represents an effort to show the generation and flow of signals through system 10 of FIG. 1.

After start up of system 10, the count in the division register 70 of the averaging unit 11 enters system 10 through bus "A" (step 60). If the Adder 12, division accumulator 14, and the quotient counter 16 are all initialized, then the adder 12 output is in an "X" slot, (X=don't care), then quotient latch 26 provides a 0 step reading to display 28 (step 62, 64, 66 and 68 respectively).

During these initial conditions, the PCL signal is at a logic 0 and a PCE signal from circuit 72 is at a logical 1 (step 70 and 72). A division disable flip-flop 22 of FIG. 1 provides a logic 0 signal (step 74); the NSUM_OVFL and the MAX_CNT signals from Adder 12 and quotient counter 16, respectively, are both logic 0 signals (steps 76, 78).

As shown at step 80, the PCL signal becomes a logical 1 placing the count stored in the division register 70 which is the count of the previous distance pulse period on bus "A" (step 82).

Before performing the first division process wherein a quotient is determined, PCE or period count enable signal goes to 0 (step 86). The division accumulator 14 has not accumulated any running sums; hence, its value is equal to 0 (step 84). The output of the quotient counter 16, reset by the PCE signal, equals a logical 0 signal or an initial count of 0 plus any offset. The offsets may be programmed on lines OD0, OD1 and OD2 as binary numbers (step 88). At this time, the ninth bit, the MAX_CNT of quotient counter 16 and the overflow port of Adder 12 are both at 0 (steps 90, 92). With these signals at a logical 0, NAND gate 24 provides a logic 1 output to the "D" input of the division disable flip-flop 22. However, the division disable output is at a logic 1 level since flip-flop 22 is clocked by a QUO_CNT signal (step 94).

When the PCL signal goes to a logical 0 and the PCE signal goes to logical 1 (steps 96, 98), the division process starts. The quotient counter 16 outputs an initial 0 step count to the quotient latch 26 (step 100). The Adder 12 outputs over bus "S" a binary value equal to the sum of the binary number on bus "A" from the division register 70 and the binary value on bus "B" from the division accumulator (step 102). As indicated at step 104, the Adder 12 makes a decision as to whether or not the value on bus "S" is greater than or equal to 262144. If it is, then as indicated at step 106, Adder 12 issues a NSUM_OVFL signal equal to a logical 1. If bus "S" is not greater than 262144, then system 10 branches to step 108 where it makes another decision as to whether or not the output of quotient counter 16 is greater than 511. If it is, then MAX_CNT equaling a logical 1 signal issues as indicated at step 110. If the output of the quotient counter is less than 511, then system 10 branches to step 112 where the QUO_CNT signal equals a logical 1, the "SUM" value is latched into the division accumulator 14 (step 114) and bus "B" equals the value on bus "S". The quotient counter 16 counts the first QUO_CNT signal which is equal to 1. Hence, the quotient counter is incremented by 1 as indicated at step 116. If the quotient counter contains a maximum count where the count equals a decimal value of 511, the MAX_CNT signal equals a logical 1, then system 10 branches to step 118 causing a DIV_DIS logical 1 signal to issue and then the count latched in quotient counter 16 is transferred to the quotient latch 26 as indicated at step 120. This count is displayed in display 28 as a step to be used to determine the frequency of the distance pulse signal. Following step 120, system 10 makes a decision as whether or not the PCL signal is at a logical 1 as indicated at step 122. If it is not, it continues to look for the signal by looping back into the flow. If not, system 10 branches to step 82 and reads the next count stored in division register 70.

System 10 also branches from steps 106 if Adder 12 overflows and a logical 1 NSUM_OVFL signal appears. In step 118 the division disable signal becomes a logical 1 and the count in the quotient counter is latched in the quotient latch and displayed at display 28.

TIMING DIAGRAMS

To further explain the operation of system 10, refer now to timing diagrams of FIGS. 3-6 and to the block of diagram of FIG. 1.

10 MILES PER HOUR

Waveform FIGS. 3A-3P shows the generation of 30 steps which indicate a speed of 10 mph on a scale of 512 steps. The reference frequency for this system, an oscillating frequency of 1.896 megahertz, which is divided down by 10 to provide a count clock (CCLK) signal having a frequency of 189.6 kilohertz for a period of 5.27 microseconds as depicted in waveform 3G.

At 10 mph, a raw distance pulse (RDP) as shown in FIG. 3A has a period of 45 ms. After the rising and falling edges of the raw distance pulse signal, 25 filter clock signals generate as indicated by the slopes in FIG. 3B. At the completion of these 25 filtered clock pulses, a valid edge (VE) pulse occurs (FIG. 3C). After the valid edge signal is established, a filtered distance pulse (FDP) signal initiates (FIG. 3D). On the rising edge of the filtered distance pulse, a PCL pulse generates (FIG. 3E). At about midway of the PCL pulse, a negative going PCE pulse generates (FIG. 3F). When the PCE generates the period counter counts the control clock pulses of FIG. 3G starting from a count of 0 and extending over until 8538 CCLK pulses are counted (FIG. 3H).

When the initial PCL pulse generates, the previous count of distance pulses are latched in the division register 70 and placed on bus "A". A binary count of illustratively 8500 was previously counted by the period counter circuit and this count is latched into the division register 70 (FIG. 3J). At the far end of waveform of FIG. 3H, the next PCL signal latches the current count of 8538 in the division register 70 (FIG. 3J).

The count in the division register and on bus "A" and the count on bus "B" from the division accumulator are added together by Adder 12 and the sum is transferred to the division accumulator 14. This sequence continues until Adder sum output is above 262143 or the quotient counter 16 counts to above 510. As indicated in FIG. 3K, the division accumulator accumulates a sum of least 262144 before the quotient counter 16 can count up 510. The quotient counter in the example counts to 30 (FIG. 3L). Hence, the MAX_CNT signal does not go low (FIG. 3M). But, however, the MSUM_OVFL signal does go low (FIG. 3N). Hence, the division disable signal issues from flip-flop 22. FIG. 3P depicts the step count of 30 being latched in the quotient latch 26. This number is displayed on display 28.

0.3225 MILES PER HOUR COMPUTATION

Refer now to FIG. 4A-4R. These timing diagrams depict the division circuit of the present invention generating a one-step count in display 28 which indicates a speed of 0.3225 mph. The reference frequency for this set of waveforms is 1.896 MHz. As depicted in FIG. 4H, the division register provides a count of 262027; hence, this register and the division accumulator has stored a count of 262027 (FIG. 4L). Hence, the Adder issues a total count of 524054 (FIG. 4P) causing an overflow signal (FIG. 4M). Consequently, only one QUO_CNT signal is counted by the quotient counter 16 (FIG. 4Q). During a second sequence, Adder 12 accumulates a sum of 523600 (FIG. 3P) which also appears in response to one QUO_CNT count. Hence, the quotient counter only counts one count step and one step is displayed on the display 28 (FIG. 4R).

Note in FIGS. 4H and 4I the period count goes to 262144 causing a 0 speed bit 17 to go high.

Adder 12 overruns very quickly much before the time the next PCL signal occurs.

To illustrate the interaction between division sequences and PCL signals, refer again to FIG. 4.

One step out of 512 steps/360° on a scale of 125 mph/270., a single step represents a speed of 0.3256 mph.

As shown in FIG. 4A, the raw distance pulse (RDP) has a frequency of 0.7234 Hz. Hence, the period of RDP equals 1.382 s. The oscillator clock frequency for system 10 is 1.896 MHz. The DIV_ACM adds a sum from adder 12 at a rate of 375 kHz. This is so because the DIV_CLK signal occurs at one-fifth the frequency of the oscillator clock. This frequency of the DIV_CLK clock will have a period of 2.667 $\mu$s which means that with a maximum of 511 add sequences at this rate, the amount of time for performing a division sequence during the period is 1.35 ms. Hence, the division sequence can occur a maximum of 740 times per second. During this span, speeds up to 333 mph could be computed. Since system 10 averages eight (8) distance pulse periods when speeds exceed 20 mph, there is 8 times the amount of time to complete a division sequence which allows for a maximum speed indication of 2566 mph. This demonstrates the upper limits of this system for performing division.

After the distance pulse averaging unit 11 receives a rising edge of the RDP, as shown by the arrow in FIGS. 4A, 4B and 4C, 25 FLT_CLK pulses, FIG. 4B, are counted before a VE signal appears as shown in FIG. 4C. The 25 FLT_CLK pulses take place within 131.8 $\mu$s. The VE pulse has a period of 5.27 $\mu$s. After detecting a rising edge of the VE signal, the distance pulse averaging unit 11 generates a FDP signal (see arrow between FIGS. 4D and 4E). This signal has a period equivalent to that of the RDP. As shown in FIG. 4E, after the occurrence of the rising edge of the FDP signal depicted in FIG. 4D, a PCL signal occurs. This signal initiates the division process of system 10. Any count that is in the period counter of the distance pulse averaging unit is latched in the division register (FIG. 4H). The PD_CNT contains a count of 262027 which is transferred to the division register as indicated in FIG. 4J. Then at the peak of the PCL pulse, a PCE signal occurs; a negative going pulse enables the PD_CNT. The PD_CNT counts the CCLK signals which occur at a frequency of 189.6 kHz which is 1/10 the frequency of the system clock. The period of the CCLK signals are illustratively 5.27 $\mu$s. PD_CNT counts, illustratively, 261800 ticks of the CCLK. However, during this period of counting, system 10 performs this division using the previous count of the PD_CNT of 262027 and determines a quotient of 1 as indicated in FIG. 4Q. This means only one QUO_CNT pulse (FIG. 4K) occur during the division process. Hence, the DIV_ACM is clocked just once causing the 262027 counts on the A bus to be summed with 262027 counts in the DIV_ACM 14. Hence, adder 12 overflows due to a count of 524054 (FIG. 4P). The NSUM_OVFL signal (FIG. 4M) is set at a logical low. Hence, the division process is complete. As shown in FIG. 4R, the QUO_LTH has one step stored and transfers this one step to display 28 (FIG. 4R).

As shown on the right side of the timing diagrams, a similar process occurs for a count of 261800 in the PD_CNT as shown on the right side of 4H. The division process once again terminates due to an overflow in adder 12 which contains a count of 523600 as depicted in FIG. 4O. Since only one QUO_CNT pulse occurs (FIG. 4K), the quotient is again 1 (FIG. 4R).

60 MILES PER HOUR

Referring now to FIGS. 5A–5Q, wave forms depict the division process at 60 mph, the filtered distance pulse signal (FIG. 5A) occurs at a rate of 133.3 Hz for a period equal to 7.5 ms, with the system clock frequency (CCLK) at 1.896 MHz. Note that in FIG. 5I the period count is 1422 ticks. The QUO_CNT is 184 clock pulses (FIG. 5K) which is less than 512 clocks. Hence, the NSUM_OVFL falls after 184 QUO_CNTs (FIG. 5M). This 184 count is stored in the QUO_LTH as depicted in FIG. 5Q.

175 MILES PER HOUR

FIGS. 6A–6Q depicts the operation of system 10 when speed is maximum or 175 mph. The filtered distance pulses (FIG. 6A) are occurring at 388.9 Hz. Note that the maximum count signals (MAX_CNT) senses 511 cycles of QUO_CNT (FIG. 6N). For this sequence, the division process stops prior to the division accumulator overflowing due to the signal MAX_CNT going low.

A SECOND EMBODIMENT

Figure 7:
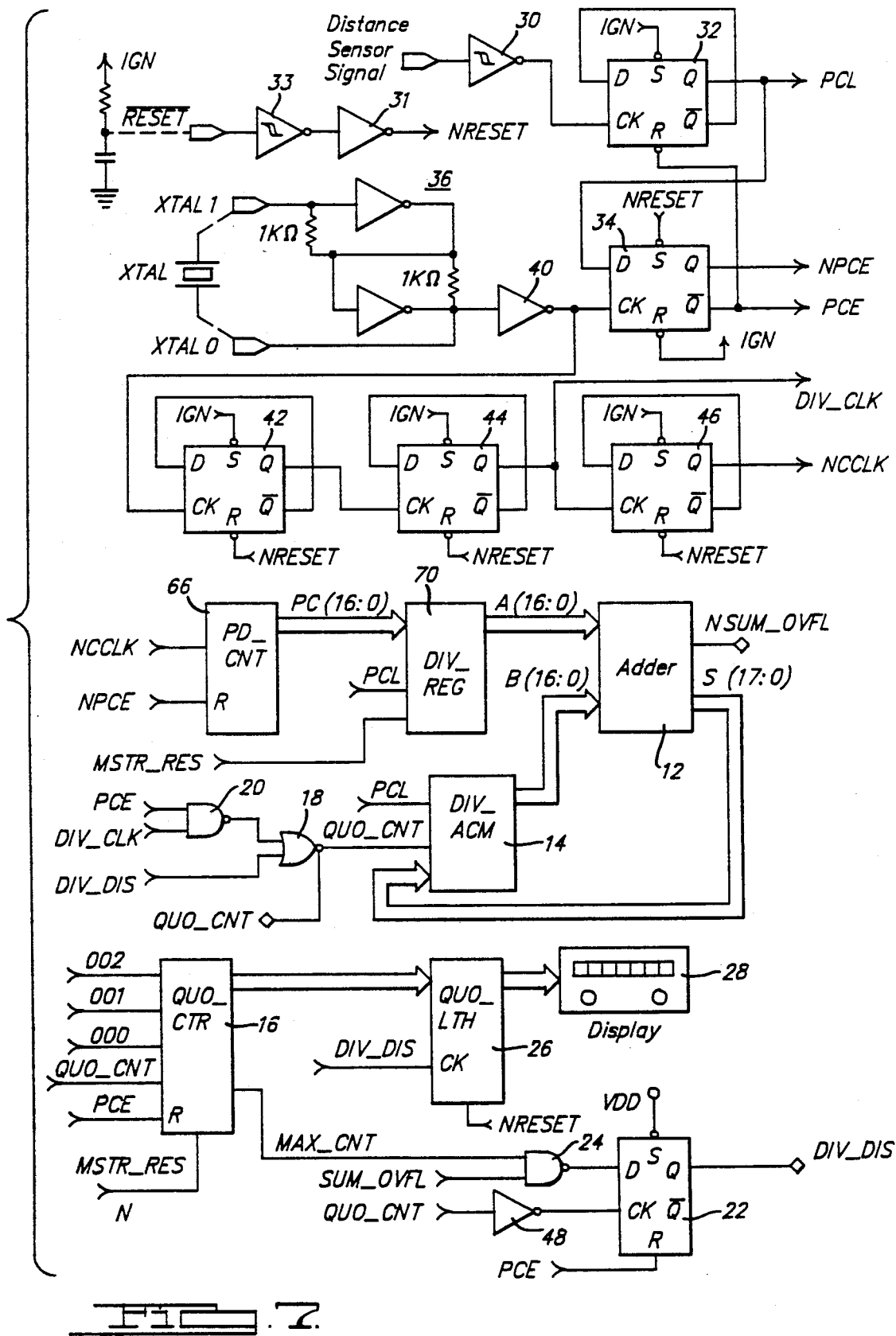
FIG. 7 depicts a second embodiment of the conversion system of this invention.

Referring now to FIG. 7, a second embodiment is depicted. This embodiment is a standalone frequency measurement system. Clock and command signals are generated from an output signal of a distance sensor (not shown) into a Schmitt trigger circuit 30, a reset signal generated from an ignition voltage via another Schmitt trigger 33, and system timing generated from a crystal oscillator 36 through an inverter 40 providing clock signals to D-latch 34 for generating the PCE signal, and a series of D-latches 42, 44 and 46 for generating the DIV_CLK and NCCLK signals. Schmitt trigger 33 provides a clock input to another D-latch 32 for generating PCL. The remainder of system 10A operates identical to the circuit that appears in system 10 of FIG. 1. The DIV_CLK signal is one-fifth of a system clock frequency; the NCCLK signal is one-tenth the clock frequency; PCL as the result of each rising edge of the distance sensor pulses NPCE is a sampling of PCL and delayed by the offset delay of the D-latch 34.

We claim:

1. A frequency measuring system for deriving frequencies of various periods of an asymmetrical pulse signal emanating from a sensor which detects changes in frequency of a measurand, said pulse signals having pulse periods varying in proportion to rates of change of the measurand, said system comprising:
   (a) a voltage level sensor means connected to receive said sensor pulse signal and producing therefrom at an output terminal a voltage level signal designated as a valid edge (VE) indicative of a rising edge of a pulse of said sensor pulse signal;
   (b) first synchronous sequential logic means having a clock input for receiving said VE signal from said voltage level sensor means and producing at an output terminal an enabling pulse signal each time a rising edge of said sensor pulse signal occurs;
   (c) a clock oscillator means of a chosen clock frequency for generating a first reference clock signal (OSC) for said system;
   (d) ripple counter means which counts at a frequency of a selected fraction of the chosen frequency of said oscillator means, having an input terminal coupled to an output terminal of said oscillator means and producing at an output terminal a second reference clock signal (CCLK) at that selected fraction of the chosen frequency;
   (e) second synchronous sequential logic means with a clock input coupled to receive said OSC signal and said VE signal and producing therefrom at output terminals a bistate period count enable (PCE) signal and its inverse (NPCE) and a period count latch signal (PCL) for initiating said frequency measuring and for resetting said first sequential logic means so that said logic means may respond to a next rising edge of said sensor pulse signal;
   (f) period counting means having an input port coupled to an output terminal of said ripple counter means for receiving said CCLK signal and accumulating binary counts representative of a duration of time during the absence of said NPCE signal and then producing at an output terminal a binary count in response to receipt of each of said CCLK signal; and
   (g) dividing circuit means having a first input port for receiving said PCL count latch signal and a second input port coupled to the output terminal of said period counting means for receiving said accumulated binary count in response to the receipt of said period count latch (PCL) signal, said latch signal latching the accumulated binary count in said dividing circuit means as divisor and for calculating a reciprocal value of the binary count by using the binary count as a divisor and successively adding the divisor until a running sum results greater than a chosen dividend value or the number of additions reaches a chosen maximum total value before the chosen dividend value is reached, and thereafter producing at an output terminal another binary count representative of a total number of sequences required to reach the dividend value or the maximum total value, the other count being a quotient of the reciprocal of the latched binary count, the quotient being a representative value of the frequency of the period represented by the latched binary count.

2. Apparatus in accordance with claim 1 wherein said dividing circuit means includes a division accumulator means that sequentially accumulates a running sum of the additions of the divisor and then producing therefrom at a first output terminal an addend during each accumulation sequence in response to a sequence count signal.

3. Apparatus in accordance with claim 2 wherein said dividing circuit means also includes a parallel adder means having a first input terminal coupled to said period measuring means for receiving each binary digit, said binary digit representing an augend, a second input terminal coupled to said first output terminal of said division accumulator means for receiving each addend from said division accumulator, a first output terminal for outputting a sum of said augend and each addend and a second output terminal for outputting an overflow signal when a carry out of a most significant bit of said adder means occur.

4. Apparatus in accordance with claim 3 wherein said division accumulator means also includes a) a first logic means having a first input terminal for receiving said enabling signal from said first sequential logic means and a further divided=down, second reference clock signal of a chosen frequency from said ripple counter means and producing therefrom at an output terminal, a first enabling conjunctive signal representing a product of an amplitude of said enabling signal and an amplitude of said divided reference signal; b) a second logic means adapted to receive at input terminals said second logic means adapted to receive at input terminals said first enabling conjunctive signal and a division-disabling signal and producing therefrom at an output terminal said sequence count signal if a sum of said first enabling conjunctive signal and said division-disabling signal produces a second enabling conjunctive output signal, said sequence count signal representing an increase in the number of times the generation of each sum of said augend and addend occurs.

5. Apparatus in accordance with claim 4 wherein said dividing circuit means also includes a quotient counter circuit having a clock input terminal coupled to said second logic means for receiving each of said sequence count signal and producing therefrom at a first output terminal a quotient value that increases in response to said sequence count signal and at a second output terminal a maximum count signal if said quotient counter overflows.

6. A frequency measuring system for determining the frequency of measurands represented by asymmetrical pulse signals emanating from a sensor used to detect changes of frequency of the measurand, said sensor pulse signals having pulse periods varying in proportion to rates of change of the measurand, said system comprising:

(a) period measuring means having an input port coupled to an output terminal of the sensor for receiving the asymmetrical pulse signals, thereafter sequentially measuring time periods between valid leading edges of adjacent pulse signals in response to an enabling signal from a period counter control circuit of said period measuring means, then sequentially storing in a storage register of said period measuring means a binary count representative of the time period between each leading valid edges of adjacent pulse signals and then producing at an output terminal a binary count representing the measured time period, in response to a latch signal of the period counter control circuit, said latch signal resetting the period measuring means after each period, said period measuring means also including a clock generating circuit for generating a reference clock signal used for providing clocking and counter operations within the system; and (b) dividing circuit means coupled to an output terminal of said period measuring means to receive sequentially each accumulated binary count for calculating a reciprocal value of the accumulated binary count by using the binary count as a divisor and successively adding the divisor until a running sum results greater than a chosen dividend value or the number of additions needed to reach a chosen maximum total value before the chosen dividend value is reached, and thereafter producing at an output terminal another binary count representative of a total number of sequences required to reach the dividend value or the maximum total value, the other binary count being a quotient of the reciprocal stored binary digit, the quotient being a representative value of the frequency of the period represented by the stored binary digit, said dividing circuit means includes a division accumulator means that sequentially accumulates a running sum of the additions of the divisor during a single period measuring interval and then producing therefrom at a first output terminal an addend during each accumulation sequence in response to a sequence count signal, said division accumulator means also includes 1) a first logic means having a first input terminal for receiving said enabling signal from the period counter control circuit and a divided-down, reference clock signal of a chosen frequency and producing therefrom at an output terminal, a first enabling conjunctive signal representing a product of an amplitude of said enabling signal and an amplitude of said divided reference signal; 2) a second logic means adapted to receive at input terminals said first enabling conjunctive signal and a division-disabling signal and producing therefrom at an output terminal said sequence count signal if a sum of said first enabling conjunctive signal and said division-disabling signal produces a second enabling conjunctive output signal, said dividing circuit means also includes a parallel adder means having a first input terminal coupled to said period measuring means for receiving each binary digit, said binary digit becoming an augend value in the adder means, a second input terminal coupled to said first output terminal of said division accumulator means for receiving each addend from said division accumulator, a first output terminal for outputting each sum of said augend and each addend and a second output terminal for outputting an overflow signal when a carry out of a most significant bit of said adder means occur during the single measuring period, said sequence count signal representing an increase in the number of times the generation of each sum of said augend and addend occurs.

7. Apparatus in accordance with claim 6 wherein said dividing circuit means also includes a quotient counter circuit having a clock input terminal coupled to said second logic means for receiving each of said sequence count signal and producing therefrom at a first output terminal a quotient value that increases in response to said sequence count signal and at a second output terminal a maximum count signal if said quotient counter exceeds a predetermined value.

* * * * *